United States Patent [19]
Lin et al.

[11] Patent Number: 5,575,669
[45] Date of Patent: Nov. 19, 1996

[54] EJECTION MECHANISM FOR EXPANSION CARD

[76] Inventors: Carol S. M. Lin, No. 3, Houng-Shi Rd., Chung-Li City, Tao Yuan Hsien; C. T. Chiu, No. 4, Alley 825, Ho-Ping Rd., Pa-Te Hsian, Tao-Yuan Hsien, both of Taiwan

[21] Appl. No.: 172,070
[22] Filed: Dec. 23, 1993
[51] Int. Cl.$^6$ ...................................................... H01R 13/62
[52] U.S. Cl. .......................................... 439/157; 439/160
[58] Field of Search ....................... 211/41; 439/152–160

[56] References Cited

U.S. PATENT DOCUMENTS 4,875,867  10/1989  Hoo ........................................... 439/157
5,338,210   8/1994  Beckham et al. ......................... 439/131
5,395,258   3/1995  Okumura et al. ......................... 439/157

Primary Examiner—David L. Pirlot
Attorney, Agent, or Firm—Larson and Taylor

[57] ABSTRACT

The invention herein is an ejection mechanism for a computer expansion card. Specifically it is for a 2-stage ejection mechanism for the expansion card that inserts in the computer. The ejection mechanism includes a body, push lever, triggering rod, etc. The push lever is made up of the travel and swinging controllers for the travel guide and swinging guide channels of the body. With the coordinated actions of the components, the push lever remains flush or is hidden within the computer housing under normal circumstances. When the user wishes to eject the card, the push lever head may be actuated to protrude from the computer housing to ease the operation of the ejection, hence the 2-stage ejection mechanism and its consequent uniqueness.

11 Claims, 7 Drawing Sheets

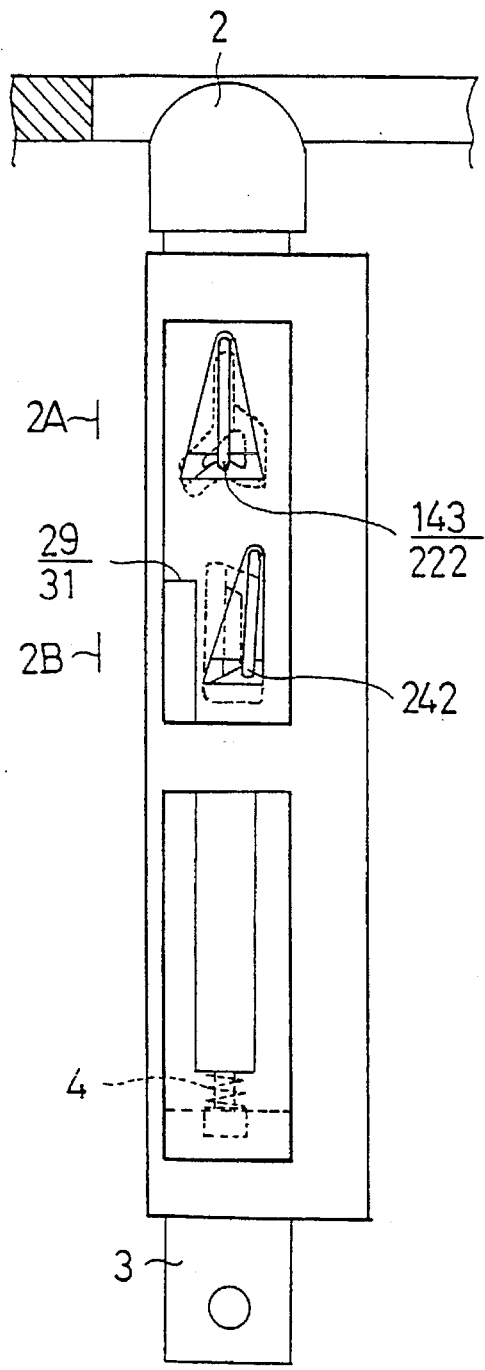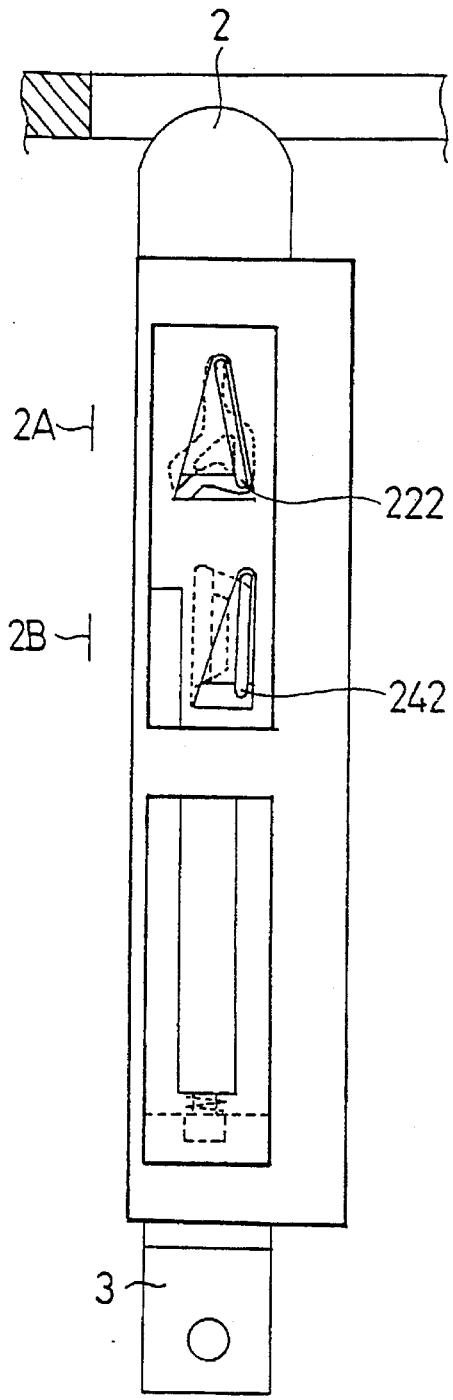
*FIG.8*  *FIG.9*

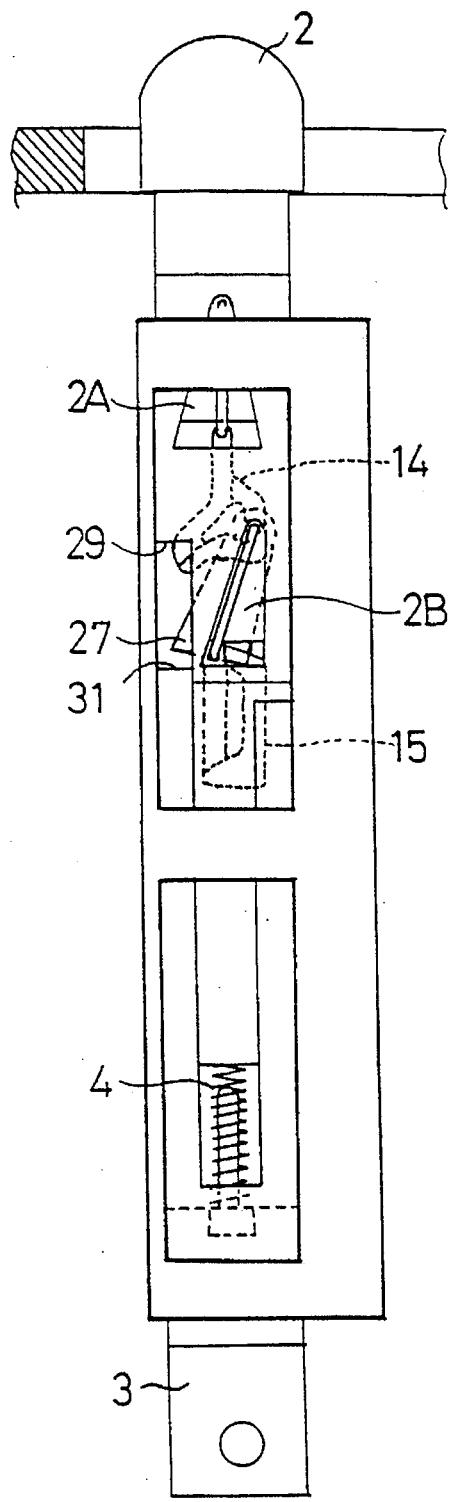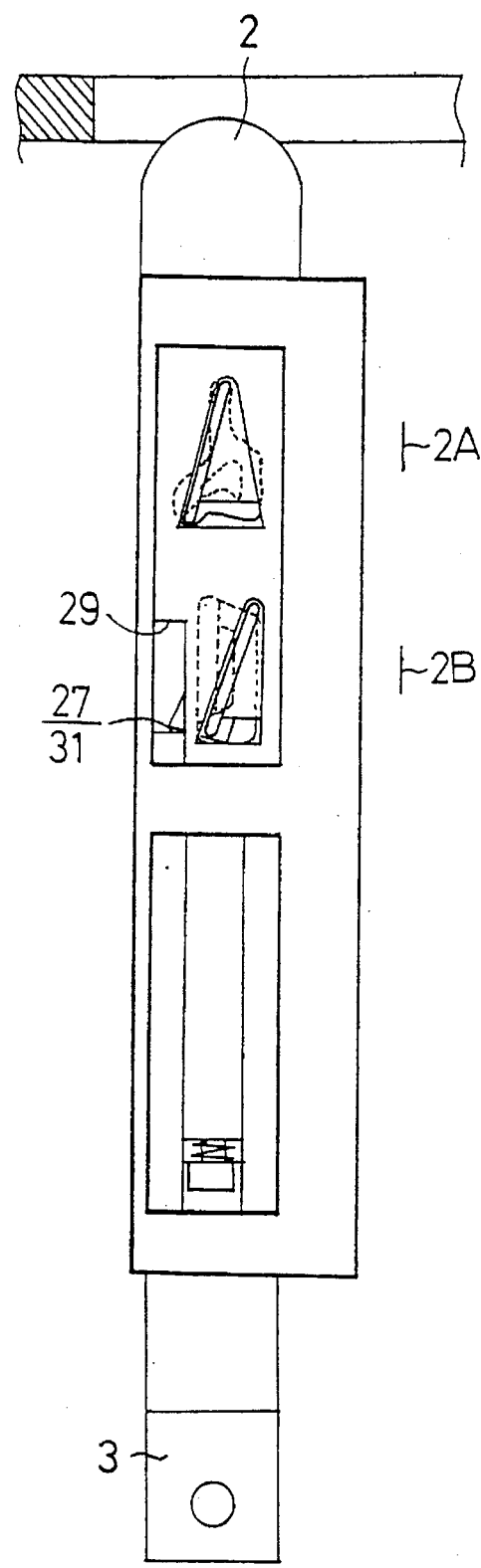
*FIG.10*      *FIG.11*

EJECTION MECHANISM FOR EXPANSION CARD

FIELD OF THE INVENTION

The present invention relates to an ejection mechanism that is usable in a notebook computer.

BACKGROUND OF THE INVENTION

The typical computer, especially the notebook type, has a socket on the side for plugging in expansion modules such as a memory card, I/O card or 1.8" HDD card. The expansion socket not only provides the retrieval operations of the cards, but also the ejection mechanism that activates the withdrawal of the card. The ejection mechanism complies with the specifications of the Personal Computer Memory Card Industry Association (PCMCIA), which means that the optimal distance for ejection operation for the push lever is set at 8 mm. However, the height of the opening in the computer housing for the expansion module socket is only 12 mm. Thus, the width of such an opening is insufficient for most users to reach into the housing with their fingers a distance of 8 mm. Hence most push levers for the ejection mechanism of the expansion module socket have an operational travel above 8 mm. This explains the inevitability of a push lever protruding more than 8 mm out from the computer housing. Therefore this type of protruding push lever is easily damaged from external impacts.

SUMMARY OF THE INVENTION

The invention herein is a 2-stage ejection mechanism for a computer expansion socket. The ejection mechanism includes a body, a push lever, and a triggering lever, etc. The push lever features a travel controller for the body's travel guide channel and swinging guide channel and for the swinging controller. With the set up of the parts, the push lever does not normally protrude from the computer housing. Yet when one wishes to operate the ejection of a plug-in card or a cassette, the push lever protrudes from the computer housing to facilitate the user's operation, hence the 2-stage ejection mechanism.

BRIEF DESCRIPTION OF THE DRAWINGS

FIG. 8 is a view of the ejection mechanism position under operational conditions.

FIG. 9 is a view of the ejection mechanism under the stage 1 of the operation, being pressed by the user.

FIG. 10 is a view of the push lever being sprung and its head protruding out of the computer housing.

FIG. 11 is a view of the push lever being pressed again, in turn pushing the triggering rod by the block.

DETAILED DESCRIPTION OF THE INVENTION

Regarding the details on the creative content of the invention herein and its projected functions, please refer to the attached figures and the following detailed descriptions.

Figure 1:
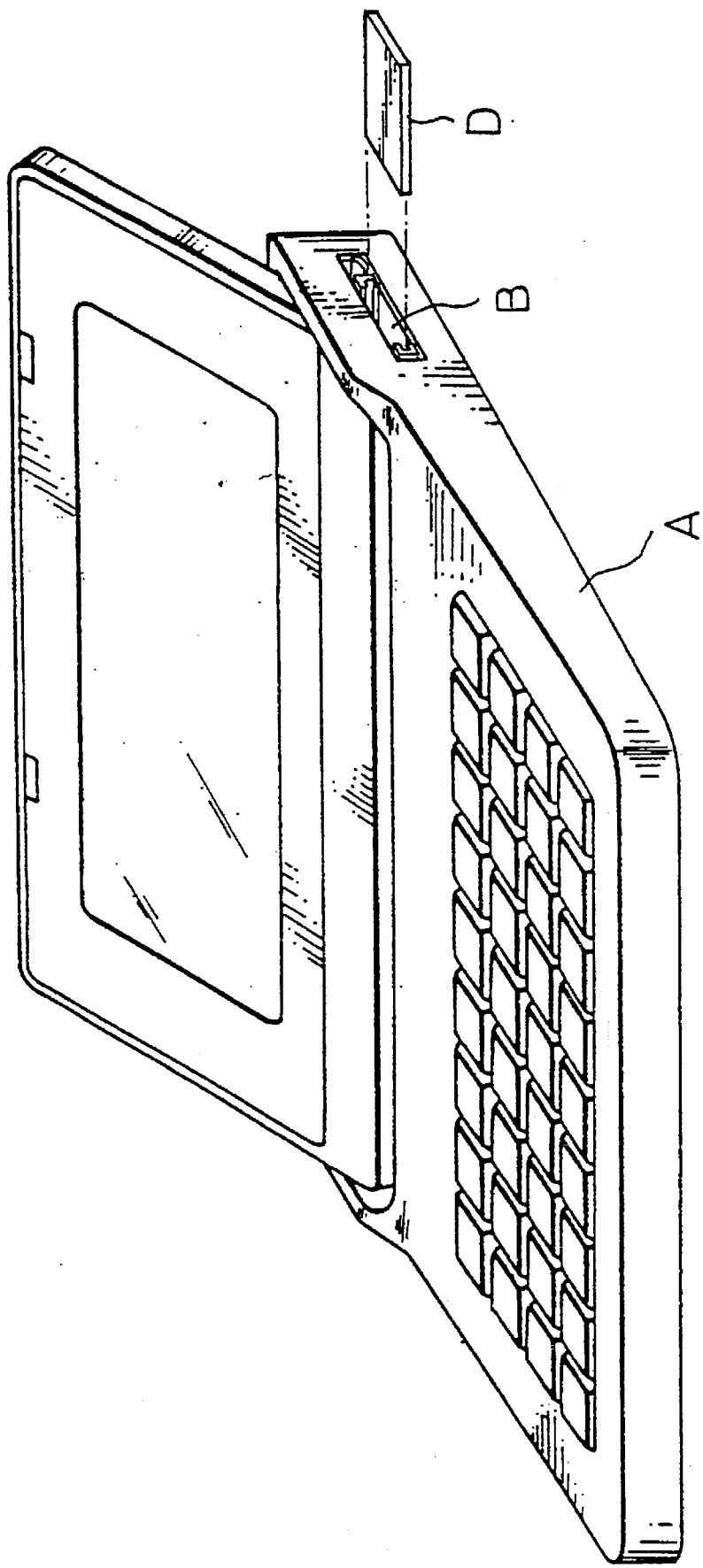
FIG. 1 is a perspective view of the relative position of the expansion module socket on the computer.
Figure 2:
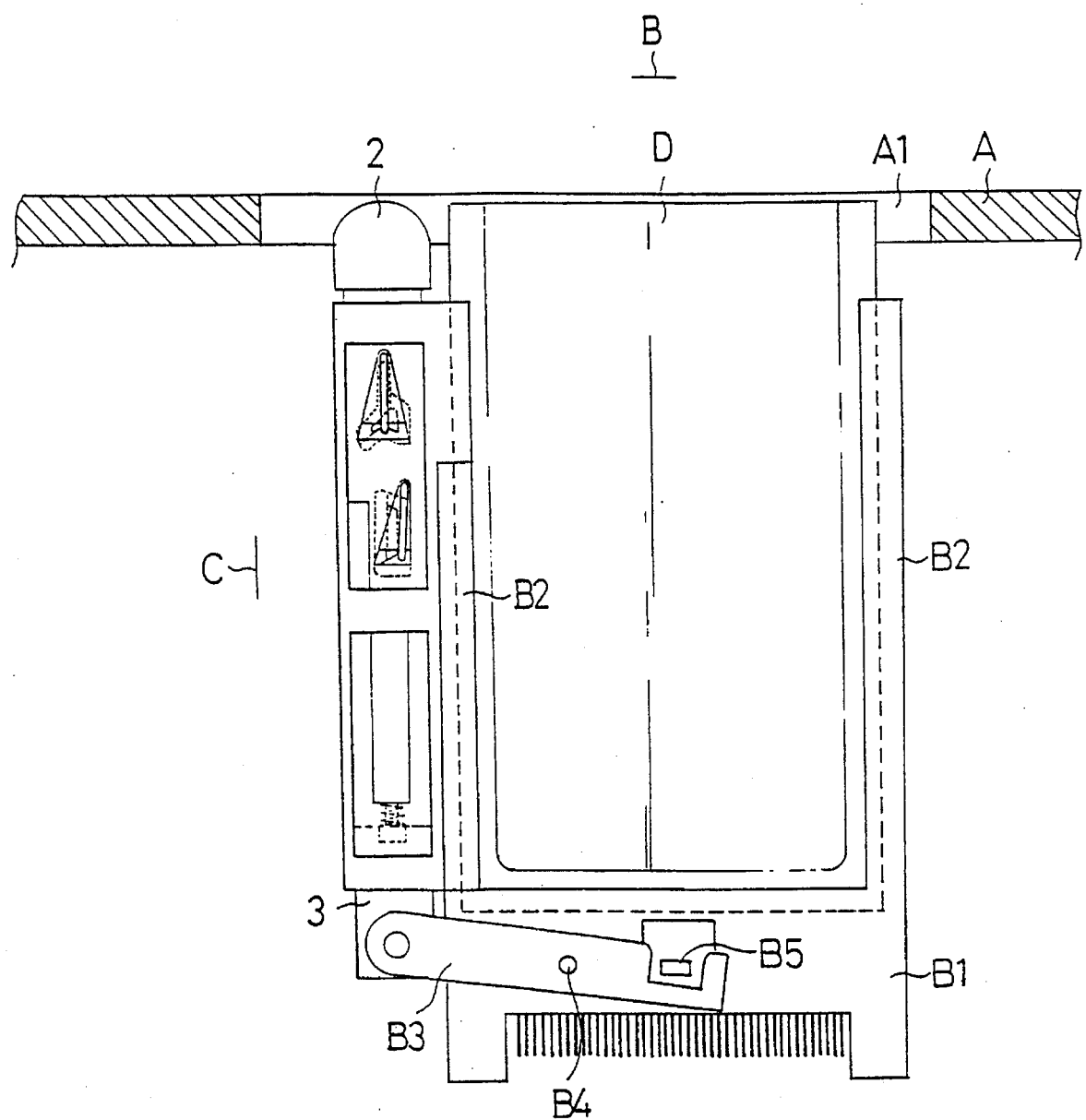
FIG. 2 is a top view of the expansion module socket and ejection mechanism relative to the computer.

Please examine FIGS. 1 and 2. On the side of a computer housing (A) is located an expansion socket (B) for plugging in a card (D). Expansion socket (B) opens out of the sides of the computer housing (A) along an opening (A1) and provides a socket seat (B1) which has two socket rails (B2) for the travel of the card (D). On one side of the socket rail (B2) is located an ejection mechanism (C). When card (D) is inserted into the socket seat (B1) and remains stationary, the top of a push lever 2 of the ejection mechanism (C) does not protrude from the opening (A1) of the housing, but remains flush with the same. The ejection mechanism includes a triggering rod 3 having a hinge and located there is a hook lever (B3) of the socket seat (B1). As the triggering rod 3 moves downward, a hook lever (B3) is pushed and turns with a hinged pivot (B4). Socket seat (B1) has a push block (B5) which in turn pushes the card (D) upward, hence relieving it from the confines of the socket seat (B1).

Figure 3:
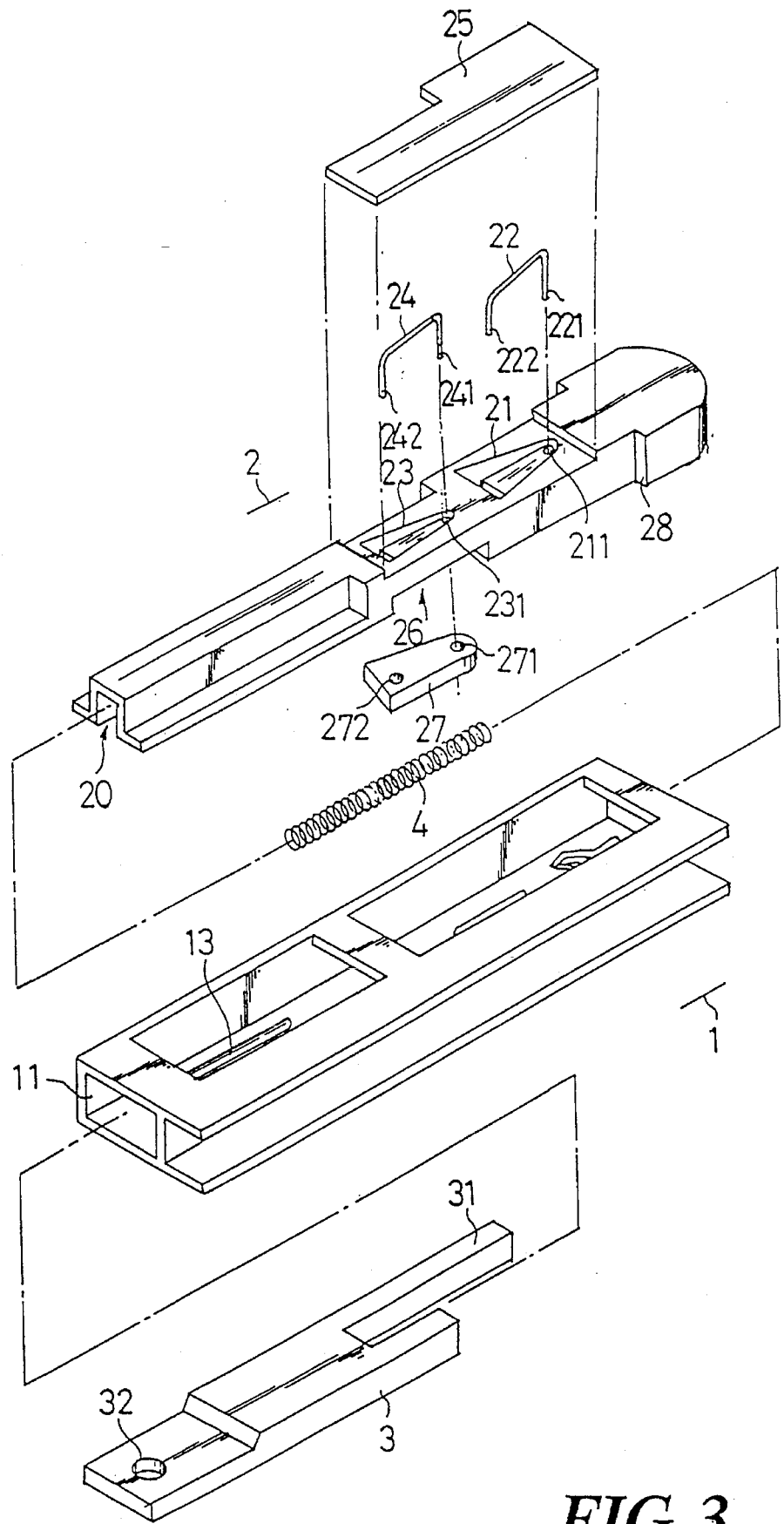
FIG. 3 is an exploded perspective view of the ejection mechanism components.

Ejection mechanism (C), as shown in FIG. 3, is made up of a body 1, push lever 2, triggering rod 3, and a spring 4. The push lever 2 has at its midsection two linearly set triangular openings 21, 23, which are set with plug-holes 211, 231 at the top corners. Facing the triangular openings 21, 23 are inverted U-shaped guide posts 22, 24, two respective ends 221, 241 of which are inserted into the plug-holes 211, 231. Above the triangular openings 21, 23 is set a lock plate 25, which secures the guide posts 22, 24 in the triangular openings 21, 23. Below the triangular opening 23 is a recess 26, in which is set a block 27. When an end 241 of the guide post 24 is inserted into the plug-hole, the insertion continues into a plug-hole 271 in the block 27. Also under the push lever 2 is located a groove 20 for retaining spring 4.

Figure 5:
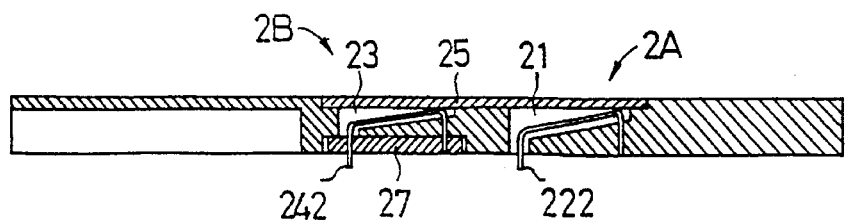
FIG. 5 is a cross-sectional view of the push lever in FIG. 4.
Figure 4:
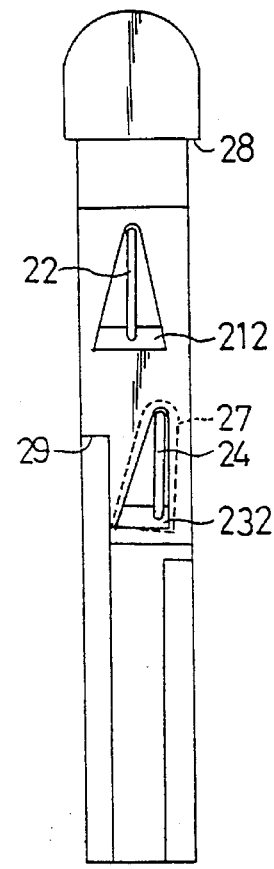
FIG. 4 is a top view of the push lever in the ejection mechanism.

Push lever 2 is made up of components as shown in FIGS. 4 and 5. The ends 221, 241 of the guide posts 22, 24 are inserted into plug-holes 211, 231 of the triangular openings 21, 23, and the other ends 222, 242 are located in the spaces 212, 232 of the opening and extend a suitable distance out from the bottom face of the push lever 2, while end 242 of guide post 24 is inserted into the other plug-hole 272 of block 27. In addition, guide posts 22, 24 are bent into two different angles of inclinations, so that the bends of the ends 221, 241 contact lock plate 25. The bends of the other ends 222, 242 are located in the spaces 21, 23 and do not contact lock plate 25. This provides the ends 222, 242 room for elastic movements and can swing with the other ends 221, 241 as the pivot. The section below guide post 22 is referred to as the travel controller (2A), while the guide post 24 section is termed the swinging controller (2B).

Figure 6:
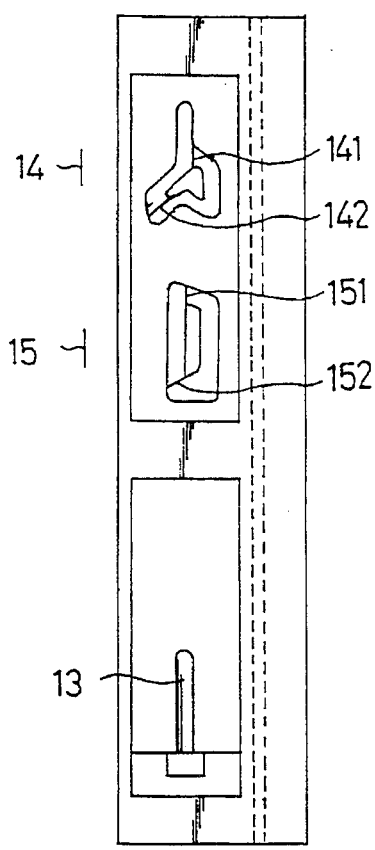
FIG. 6 is a top view of the ejection mechanism body.
Figure 7:
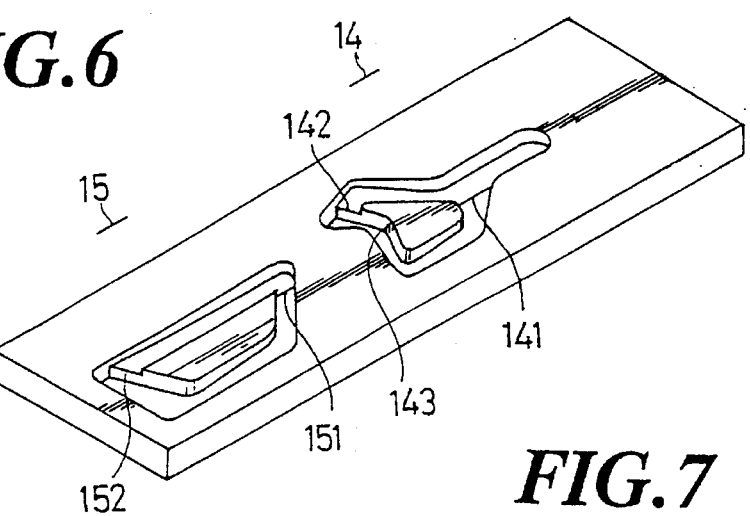
FIG. 7 is an enlarged perspective view of the travel guide channel & swinging guide channel in FIG. 6.
Figure 12:
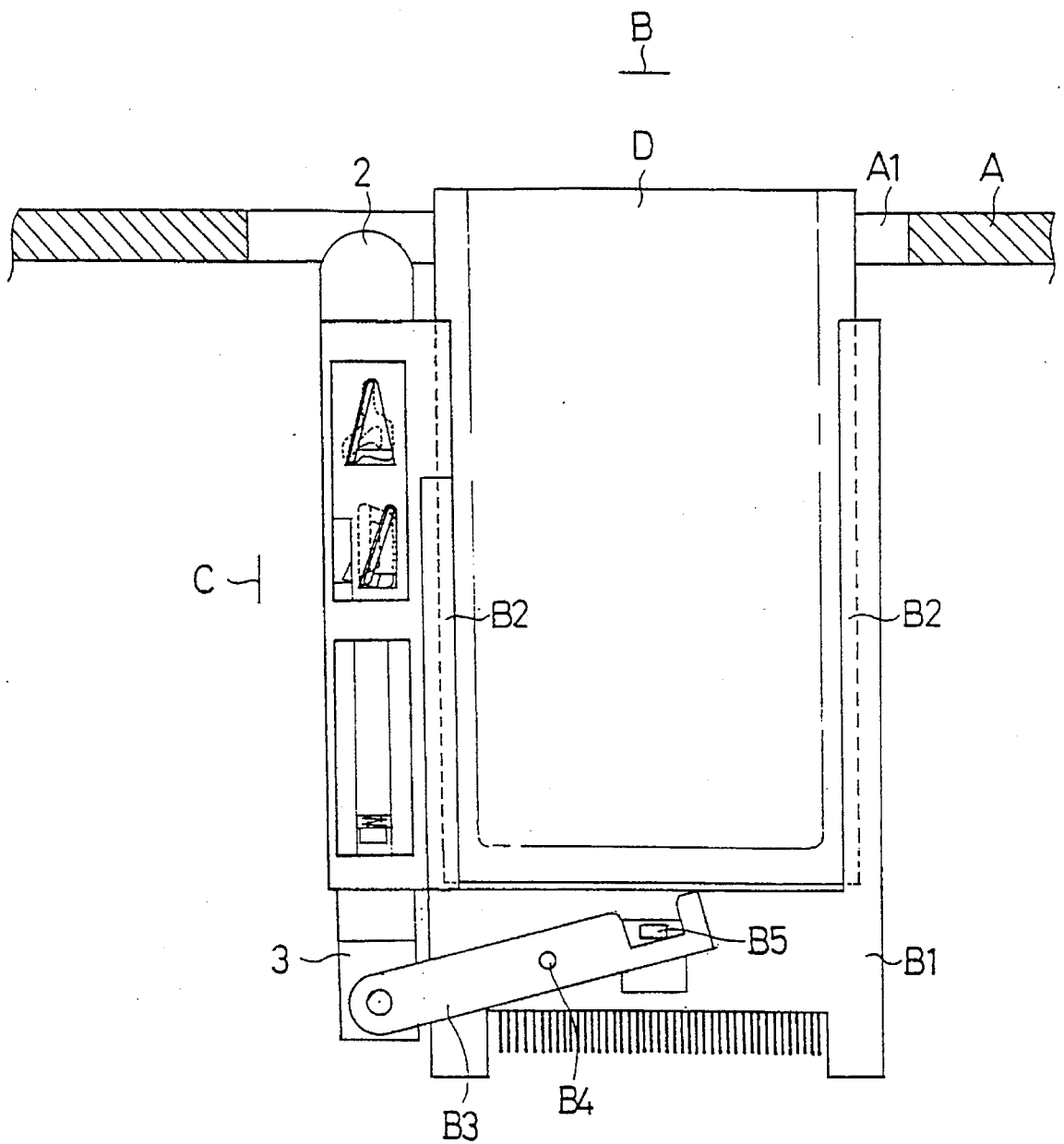
FIG. 12 is an overall view of the card in FIG. 11 being ejected.

In addition, the body 1 configuration is shown in FIGS. 3, 6 and 7 and has for the push lever 2 a sliding channel 11, which allows the push lever 2 to travel in sliding channel 11. About the lower section of sliding channel 11 is located a spring support 13 for spring 4. One side of body 1 is connected to socket rail (B2) of the expansion socket (B), thus positioning body 1 to one side of expansion socket (B).

Furthermore, near the upper section of sliding channel 11 of body 1, the interior surface is set with a travel guide channel 14 and a swinging guide channel 15 as related to the travel controller (2A) and swinging controller (2B) for push lever 2. Guide channels 14, 15 are suitably deep in relation to the protrusion of the ends 222, 242 of the guide posts from the lower face of push lever 2. At about the upper and lower ends of the guide channels 14, 15 are gradual variations in depth of the channels, or an upper gradation 141, 151 and a lower gradation 142, 152. Located at the lower center of guide channel 14 is a stop 143, which has a concave shape.

Also, triggering rod 3 slides while inserted inside body 1; while its upper section is the extension 31 of a contact part 29 on push lever 2 and its lower section has a hinge hole 32 for the pivot of a hook lever (B3) of the socket seat on the expansion socket (B).

The ejection mechanism (C), made up of the aforesaid components, is in the position shown in the FIGS. 2 and 8 under typical circumstances. The guide post 22 motivates spring 4 in the spring groove 20 upwardly at which time the end 222 of guide post 22 is deep within the guide channel 14 and stationed in the stop 142. This prevents push lever 2 from springing upwardly. At the same time, end 242 of guide post 24 is being guided by the inclined surface of guide channel 15 and is on the right face of the guide channel 15. At this stage, the extension 31 of the triggering rod 3 is touching the contact part 29 of push lever 2.

The above-mentioned situation applies to that of a card (D) which is already inserted in the expansion socket (B). To remove card (D) from the expansion socket (B), the user presses the head of push lever 2 with a finger. This allows limiter 28 of the push lever head to touch the upper part of body 1. This is also the end point of the downward travel of push lever 2, as shown in FIG. 9. At this time the end 222 of guide post 22 is being urged by the inclination of the guide channel 14 and swings to the right, which allows the end 222 of guide post 22 to be released from the confines of the travel guide stop 143. When the user releases the pressure, and due to the escape of guide post end 222 from stop 143, push lever 2 is sprung upwardly by spring 4, while triggering rod 3 stays at its original position, as shown in FIG. 10. The head of push lever 2, due to the spring action, protrudes from the computer housing (A), at which time the guide post end 222 jumps over the upper gradation 141 of the travel guide channel 14, while the stop at the upper part of the travel guide channel 14 is the end of the travel for the push lever 2 as it is sprung upward. As for the end 242 of guide post 24, due to the upward movement of the push lever 2, it also jumps over the upper gradation 151 of the swinging guide channel 15, which leads the end 242 to swing to the left, hence the end 242 urges one side of block 27 to swing left and forming a convex. The convex portion of block 27 now replaces the original position of contact part 29 on the push lever 2, while the other side of block 27 contacts the lower face of recess 26 on push lever 2.

Furthermore, as the user again presses the push lever 2 to move downwardly, one side of the convex of block 27 on push lever 2 contacts the extension 31 of triggering rod 3, and moves triggering rod 3 downwardly to the position shown in FIGS. 22 and 23. Due to the triggering rod 3 moving downwardly, hook lever (B3) of expansion socket seat (B1) is in turn urged with pivot (B4) and pushes push block (B5) on the socket seat, hence ejecting card (D) out of socket seat (B1). As push lever 2 moves from its upper starting point to the lower end point, the guide post ends 222, 242 follow the left bank of guide channel 14 and swinging guide channel 15 as they slide downwardly. Due to the limitation of the upper gradations 141, 151, guide post ends 222, 242 will not reverse into the right bank of guide channels 14, 15. At the same time, when the guide post ends 222, 242 reach the lower end, they also jump over the lower gradations 142, 152, so that as the user eases up on the pressure, push lever 2 is again sprung upwardly by spring 4. At this time, guide post ends 222, 242, due to the limitation of the lower gradations 142, 152, are led by guide channels 14, 15 to their original positions as shown in FIG. 8, hence completing the travel cycle of guide post ends 222, 242 through guide channels 14, 15. Also, block 27 of triggering rod 3 retracts to the right as it is led by guide post end 242, so that the upward travel of triggering rod 3 is unaffected at the next insertion of card (D).

In summary, the invention herein disclosed utilizes the coordinated actin s between the travel controller and swinging controller of the push lever and the sliding channel of the body hence achieving a 2-stage retrieval in an ejection operation. This provides a flush or retracted position of the push lever on the ejection mechanism under normal circumstances, and a lever that does not protrude from the computer housing, hence preventing its damage from any external impacts.

We claim:

1. An ejection mechanism for a computer expansion card comprising a body, a push lever, two inverted U-shaped guide posts, each having an end that protrudes downwardly past a lower face of the push lever a suitable distance, and which can pivot left and right or move up and down; and a block that is moved by the guide post end such that as the push lever moves up, one side of the block forms a convex surface and replaces the original position of a contact part of the push lever;

said body includes a sliding channel that includes a cycle-type travel guide channel and a swinging guide channel as related to the guide post ends on said push lever, said guide channels having a depth to accommodate the distance protruded by the guide post ends from lower faces of the push lever, hence allowing the ends of the push lever to be the lead for the cycling of the guide channels;

said upper section of said push lever forms an extension that reacts with the push lever contact part.

2. An ejection mechanism for expansion card claimed in claim 1, wherein the ejection mechanism for expansion card, the ends (242) of the guide posts (24) inserts into the other plug-hole (272) of the block.

3. An ejection mechanism for expansion card as claimed in claim 1, wherein said guide channels have a bottom, an upper portion and a lower portion, said portions having respective upper and lower gradations which vary in depths according to the slope of the channel bottom.

4. An ejection mechanism for expansion card as claimed in claim 1, wherein the lower center of said guide channel is set with a concave-shaped stop.

5. An ejection mechanism for expansion card as claimed in claim 1, wherein said push lever includes a head;

and further including a limiter which contacts the upper part of the body and is set in the head of the push lever.

6. An ejection mechanism for an expansion card as claimed in claim 1, wherein the ejection mechanism for the expansion card, the travel guide controller and swinging controller of the push lever include at their midsection two linearly placed triangular openings, at the upper ends of which are plug-holes for said guide post ends.

7. An ejection mechanism as claimed in claim 6, wherein the ejection mechanism for the expansion card further includes a lock plate which is secured at an upper face of said triangular openings.

8. An ejection mechanism as claimed in claim 6, wherein the ejection mechanism for the expansion card further includes a lock plate which is secured at an upper face of said triangular openings; and wherein said inverted-U guide posts are bent and inclined in two difference configurations, which allows the bends in the guide post ends to contact the lock plate, while the other ends of the guide post ends are located in the triangular openings without contacting the lock plate.

9. An ejection mechanism for expansion card as claimed in claim 6, wherein said block is set in the recess of the lower part of one of said triangular openings and in turn is set with a plug-hole, into which is inserted the guide post end and which provides a protrusion as it extends beyond the plug-hole.

10. An ejection mechanism for expansion card as claimed in claim 1, and further including a spring and a recess for the spring, the spring recess for the spring being located in the lower section of the push lever.

11. An ejection mechanism for expansion card as claimed in claim 10, wherein the spring action from the said push lever is derived from the spring.

* * * * *